United States Patent [19]
Zhang et al.

[11] Patent Number: 5,879,977
[45] Date of Patent: *Mar. 9, 1999

[54] PROCESS FOR FABRICATING A THIN FILM TRANSISTOR SEMICONDUCTOR DEVICE

[75] Inventors: Hongyong Zhang; Hideki Uochi; Toru Takayama, all of Kanagawa; Shunpei Yamazaki, Tokyo; Yasuhiko Takemura, Kanagawa, all of Japan

[73] Assignee: Semiconductor Energy Laboratory Co., Ltd., Kanagawa, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 636,819

[22] Filed: Apr. 23, 1996

Related U.S. Application Data

[63] Continuation of Ser. No. 195,714, Feb. 14, 1994, abandoned.

[30] Foreign Application Priority Data

Feb. 15, 1993 [JP] Japan ..................................... 5-048532

[51] Int. Cl.⁶ ................................................ H01L 21/10
[52] U.S. Cl. ............................. 438/166; 438/96; 438/97; 438/149; 438/154; 257/66; 117/8
[58] Field of Search .............................. 437/83, 200, 201, 437/21, 40 TFT, 41 TFT, 88, 174, 973, 10; 148/DIG. 9, DIG. 93, DIG. 16; 438/166, 308, 486, 487, 705, 96, 91, 149, 154

[56] References Cited

U.S. PATENT DOCUMENTS

| | | | |
|---|---|---|---|
| 3,919,765 | 11/1975 | Schloetterer | 148/DIG. 60 |
| 4,046,608 | 9/1977 | van Iseghem et al. | 437/10 |
| 4,215,156 | 7/1980 | Dalal et al. | 204/192.17 |
| 4,231,809 | 11/1980 | Schmidt . | |
| 4,331,485 | 5/1982 | Gat | 437/942 |
| 4,379,020 | 4/1983 | Glaeser et al. . | |

(List continued on next page.)

FOREIGN PATENT DOCUMENTS

| | | | |
|---|---|---|---|
| 1-187874 | 7/1989 | Japan | 437/83 |
| 1-187875 | 7/1989 | Japan | 437/83 |
| 2-140915 | 5/1990 | Japan | 437/83 |
| 2-275641 | 11/1990 | Japan | 437/83 |
| 3-280418 | 12/1991 | Japan | 437/83 |
| 3-280420 | 12/1991 | Japan . | |

OTHER PUBLICATIONS

J. Grant, *Hackh's Chemical Dictionary*—American and British Usage, pp. 10–11, 332–333, Fourth Edition, 1969.

S. Ghandi, "VLSI Fabrication Principles—Silicon and Gallium Arsenide", pp. 517–520, 1983.

R. Kakkad et al., "Crystallized Si Films by Low–Temperature Rapid Thermal Annealing of Amorphous Silicon", J. Appl. Phys. vol. 65, No. 5, pp. 2069–2072, Mar. 1, 1989.

G. Liu et al., "Polycrystalline Silicon Thin Film Transistors on Corning 7059 Glass Substrates Using Short Time, Low–Temperature Processing", Appl. Phys. Lett., vol. 62, No. 20, pp. 2554–2556, May 17, 1993.

(List continued on next page.)

*Primary Examiner*—Charles Bowers
*Assistant Examiner*—David S. Blum
*Attorney, Agent, or Firm*—Sixbey, Friedman, Leedom & Ferguson, P.C.; Gerald J. Ferguson, Jr.; Jeffrey L. Costellia

[57] ABSTRACT

A process for fabricating a semiconductor by crystallizing a silicon film in a substantially amorphous state by annealing it at a temperature not higher than the crystallization temperature of amorphous silicon, and it comprises forming selectively, on the surface or under an amorphous silicon film, a coating, particles, clusters, and the like containing nickel, iron, cobalt, platinum or palladium either as a pure metal or a compound thereof such as a silicide, a salt, and the like, shaped into island-like portions, linear portions, stripes, or dots; and then annealing the resulting structure at a temperature lower than the crystallization temperature of an amorphous silicon by 20° to 150° C.

32 Claims, 7 Drawing Sheets

5,879,977
Page 2

U.S. PATENT DOCUMENTS

| | | | |
|---|---|---|---|
| 4,383,883 | 5/1983 | Mizutani | 437/83 |
| 4,481,121 | 11/1984 | Zhang et al. . | |
| 4,561,171 | 12/1985 | Schlosser | 148/DIG. 60 |
| 4,758,533 | 7/1988 | Magee et al. | 148/DIG. 93 |
| 4,954,855 | 9/1990 | Mimura et al. . | |
| 5,147,826 | 9/1992 | Liu et al. | 437/233 |
| 5,162,241 | 11/1992 | Mori et al. | 148/DIG. 60 |
| 5,169,680 | 12/1992 | Ting et al. | 437/238 |
| 5,244,819 | 9/1993 | Yue | 437/12 |
| 5,272,119 | 12/1993 | Falster | 437/12 |
| 5,275,851 | 1/1994 | Fonash et al. . | |
| 5,278,093 | 1/1994 | Yonehara | 437/973 |
| 5,403,772 | 4/1995 | Zhang et al. . | |
| 5,407,867 | 4/1995 | Iwasaki et al. . | |
| 5,426,064 | 6/1995 | Zhang et al. . | |
| 5,488,000 | 1/1996 | Zhang et al. . | |
| 5,492,843 | 2/1996 | Adachi et al. . | |
| 5,501,989 | 3/1996 | Takayama et al. . | |
| 5,508,533 | 4/1996 | Takemura . | |
| 5,529,937 | 6/1996 | Zhang et al. . | |
| 5,531,182 | 7/1996 | Yonehara | 437/967 |
| 5,534,716 | 7/1996 | Takemura . | |
| 5,543,352 | 8/1996 | Ohtani et al. . | |
| 5,560,804 | 10/1996 | Higuchi et al. . | |
| 5,563,426 | 10/1996 | Zhang et al. . | |
| 5,569,610 | 10/1996 | Zhang et al. . | |
| 5,569,936 | 10/1996 | Zhang et al. . | |
| 5,580,792 | 12/1996 | Zhang et al. . | |
| 5,580,824 | 12/1996 | Tanaka et al. . | |
| 5,585,291 | 12/1996 | Ohtani et al. . | |
| 5,589,694 | 12/1996 | Takayama et al. . | |
| 5,595,923 | 1/1997 | Zhang et al. . | |
| 5,595,944 | 1/1997 | Zhang et al. . | |
| 5,604,360 | 2/1997 | Zhang et al. . | |
| 5,605,846 | 2/1997 | Ohtani et al. . | |
| 5,606,179 | 2/1997 | Yamazaki et al. . | |
| 5,608,232 | 3/1997 | Yamazaki et al. . | |
| 5,612,250 | 3/1997 | Ohtani et al. . | |
| 5,614,426 | 3/1997 | Funada et al. . | |
| 5,614,733 | 3/1997 | Zhang et al. . | |
| 5,616,506 | 4/1997 | Takemura . | |
| 5,620,910 | 4/1997 | Teramoto . | |
| 5,621,224 | 4/1997 | Yamazaki et al. . | |
| 5,624,851 | 4/1997 | Takayama et al. . | |
| 5,637,515 | 6/1997 | Takemura . | |
| 5,639,698 | 6/1997 | Yamazaki et al. . | |
| 5,643,826 | 7/1997 | Ohtani et al. . | |
| 5,646,424 | 7/1997 | Zhang et al. . | |
| 5,654,203 | 8/1997 | Ohtani et al. . | |
| 5,656,825 | 8/1997 | Kusumoto et al. . | |
| 5,663,077 | 9/1997 | Adachi et al. . | |
| 5,677,549 | 10/1997 | Takayama et al. . | |
| 5,696,386 | 12/1997 | Yamazaki . | |
| 5,696,388 | 12/1997 | Funada et al. . | |
| 5,700,333 | 12/1997 | Yamazaki et al. . | |
| 5,705,829 | 1/1998 | Miyanaga et al. . | |
| 5,712,191 | 1/1998 | Nakajima et al. . | |
| 5,731,613 | 3/1998 | Yamazaki et al. . | |
| 5,756,364 | 5/1998 | Tanaka et al. . | |

OTHER PUBLICATIONS

G. Liu et al., "Selective Area Crystallization of Amorphous Silicon Films by Low–Temperature Rapid Annealing Thermal Annealing", vol. 55, No. 7, pp. 660–662, Aug. 14, 1989.

R. Kakkad et al., "Low–Temperature Selective Crystallization of Amorphous Silicon", Journal of Non–Crystalline Solids, vol. 115, Nos. 1–13, pp. 66–68, Aug. 1989.

Y. Kawazu, et al. Jpn. J.Appl. Phys., 29,12 (1990) 2698 "Crystallization of a–Si:H Induced By Nickel Silicide".

R.C. Cammarata, et al., J. Mater. Res., 5,10 (1990) 2133 "Si Crystallization in Ni Implanted a–Si Films".

R.C. Cammarata, et al., Appl. Phys. Lett., 51,14(1987) 1106 "$Ni8i_2$ Precipitation in Ni Implanted Si Films".

C. Hayzelden et al., "In Situ Transmission Electron Microscopy Studies of Silicide–Mediated Crystallization of Amorphous Silicon" Appl. Phys. Lett. 60(2)(1992) 225.

C. Hayzelden, et al., J. Appl.. Phys., 73,12(1993)8779 "Silicide Mediated Crystallization of Ni Implanted A–Si".

A.Y. Kuznetsov, et al., Royal Micr. Soc. Conf. Proc., 1993 "Silicide Precipitate Formation . . . $Ni^+$ Implanted A–Si".

A.V. Dvurechenskii et al., "Transport Phenomena in Amorphous Silicon Doped by Ion Implantation of 3d Metals", pp. 635–640, Phys. Stat. 501 A95 (1986).

T. Hempel et al., "Needle–Like Crystallization of Ni Doped Amorphous Silicon Thin Films", *Solid State Communications,* vol. 85, No. 11, pp. 921–924, 1993.

J.L. Batstone et al., Solid State Phen., 37–38(1994) 257 "Microscopic Processes Incrystallization".

S. Wolf & R.N. Tauber, "Silicon Processing For the VLSI Eva", vol. 1, 1986, pp. 39, 51–53, 61–71, 531–535, 546, 581.

C. Hayzelden et al., "In Situ Transmission Electron Microscopy Studies of Silicide–Mediated Crystallization of Amorphous Silicon" (3 pages).

A.V. Dvurechenskii et al., "Transport Phenomena in Amorphous Silicon Doped by Ion Implantation of 3d Metals", *Akademikian Lavrentev Prospekt* 13, 630090 Novosibirsk 90, USSR pp. 635–640.

T. Hempel et al., "Needle–Like Crystallization of Ni Doped Amorphous Silicon Thin Films", *Solid State Communications,* vol. 85, No. 11, pp. 921–924, 1993.

Translation of JP 2–140915.

S. Caune et al., Appl. Surf. Sci., 36(1989) 597 "Combined CW Laser And Furnace Annealing of a–Si . . . ".

Lau, S., et al., Thin Solid Films, 47(1977), pp. 313–322.

Ghandhi, S.K., VLSI Fabrication Principles, John Wiley & Sons, 1983, pp. 522–526.

Kawazu, et al., Jap. J. Appl. Phys., vol. 29, No. 12, Dec. 1990, pp. 2698–2704.

PROCESS FOR FABRICATING A THIN FILM TRANSISTOR SEMICONDUCTOR DEVICE

This is a Continuation of application Ser. No. 08/195,714, filed Feb. 14, 1994, now abandoned.

BACKGROUND OF THE INVENTION

1. Field of the Invention

The present invention relates to a crystalline semiconductor for use in thin film devices such as thin-film insulated-gate field-effect transistors (hereinafter referred to simply as "thin film transistors" or "TFTs"), and to a process for fabricating the same.

2. Prior Art

Thin films of crystalline silicon semiconductor for use in thin film devices such as TFTs known heretofore have been fabricated by crystallizing an amorphous silicon film formed through plasma CVD (chemical vapor deposition) or thermal CVD, using an apparatus such as an electric furnace maintained at a temperature of not lower than 600° C. for a duration of 12 hours or longer. Thin films of crystalline silicon semiconductor having sufficiently high quality (for example, an excellent field effect mobility and a high reliability) are available only after subjecting the amorphous film to a heat treatment for a still longer duration.

However, those prior art processes for obtaining thin films of crystalline silicon semiconductor suffer various problems yet to be solved. One of the problems is the low throughput which increases the process cost. For instance, if a duration of 24 hours is required for the crystallization step, and by considering that the process time for a single substrate is preferably within 2 minutes, 720 substrates must be processed at a time. However, the maximum number of substrates which can be treated at a time in an ordinary tubular furnace is limited to 50; in a practical treatment using only one apparatus (reaction tube), it has been found that a single substrate requires 30 minutes to complete the treatment. In other words, at least 15 reaction tubes are necessary to complete the reaction per single substrate in 2 minutes. This signifies that such a process increases the investment cost and therefore increases the product price due to a too large depreciation for the investment.

The temperature of the heat treatment is another problem to be considered. In general, a TFT is fabricated using a quartz glass substrate comprising pure silicon oxide or an alkali-free borosilicate glass substrate such as the #7059 glass substrate manufactured by Corning Incorporated (hereinafter referred to simply as "Corning #7059 substrate"). The former substrate has such an excellent heat resistance that it can be treated in the same manner as in a conventional wafer process for semiconductor integrated circuits. However, it is expensive, and, moreover, the price increases exponentially with increasing area of the substrate. Thus, at present, the use of quartz glass substrates is limited to TFT integrated circuits having a relatively small area.

On the other hand, alkali-free borosilicate glass substrates are inexpensive as compared to those made of quartz glass, however, they have shortcomings with respect to their heat resistance. Since an alkali-free glass substrate undergoes deformation at a temperature in the range of from 550° to 650° C., and more particularly, since a readily available material undergoes deformation at a temperature as low as 600° C. or even lower, any heat treatment at 600° C. causes an irreversible shrinkage and warping to form on the substrate. These deformations appear particularly distinctly on a substrate having a diagonal length of more than 10 inches. Accordingly, it is believed requisite to perform the heat treatment on a silicon semiconductor film at a temperature of 550° C. or lower and for a duration of within 4 hours to reduce the entire process cost.

SUMMARY OF THE INVENTION

In the light of the circumstances as described in the foregoing, an object of the present invention is to provide a semiconductor in which the problems above are overcome and a process for fabricating the same. Another object of the present invention is to provide a process for fabricating a semiconductor device using the same semiconductor.

The present invention provides a process which is characterized in that it comprises: forming, on an amorphous silicon film or on a film which has such a disordered crystalline state that it can be regarded as being amorphous (for example, a state which comprises crystalline portions and amorphous portions in a mixed state), a film, particles, clusters, lines, and the like containing at least one of nickel, iron, cobalt, platinum and palladium; and annealing the resulting structure at a temperature lower than the crystallization temperature of a conventional amorphous silicon by, preferably, 20° to 150° C., or at a temperature not higher than the glass transition temperature of the glass material conventionally used as a substrate, e.g., at 580° C. or lower.

BRIEF DESCRIPTION OF THE DRAWINGS

FIGS. 2(A-1), 2(A-2), 2(B), 2(C) and 2(D) show schematically drawn step-sequential cross section structures obtained in another process according to another embodiment of the present invention (steps of selective crystallization);

FIGS. 6(A-1), 6(A-2), 6(B), 6(C) and 6(D) show schematically drawn step-sequential cross section structures obtained in a process for fabricating a semiconductor according to a yet another embodiment of the present invention;

DETAILED DESCRIPTION OF THE INVENTION

Conventionally proposed methods for the crystallization of a silicon film include a solid phase epitaxial growth from a seed crystal, using crystalline island like films as the nuclei, as disclosed in JP-A-1-214110 (the term "JP-A-" as used herein signifies "an unexamined published Japanese patent application"). However, it was found that substantially no crystal growth proceed at a temperature of 600° C. or lower. In the case of a silicon based material, in general, the crystallization thereof proceeds in such a manner that the molecular chains in an amorphous state are once cut, and after establishing a state in which no recombination between the cut molecules occurs, the molecules are assembled into a part of a crystal in accordance with a crystalline molecule. The energy necessary to maintain the once cut molecular chains to stand alone is quite large, and hence, this step of maintaining the cut molecules separated from each other is the barrier in the crystallization reaction. This energy corresponds to a heating at a temperature of about 1,000° C. for a duration of several minutes, or to a heating at about 600° C. for several tens of hours. Since the heating duration depends exponentially on the heating temperature, i.e., energy, it was found practically unfeasible to perform the crystallization at a temperature not higher than 600° C., more specifically for example, at 500° C. A prior art concept of solid phase epitaxial crystallization also failed to provide a solution to this problem.

The present inventors considered, apart from the conventionally established theory of solid phase crystallization, of a means of lowering the barrier energy of the aforementioned process by a catalytic reaction. Thus, the present inventors noticed that nickel (Ni), iron (Fe), cobalt (Co), platinum (Pt) and palladium (Pd) have good affinity with silicon and that they may easily form a silicide. In the case of nickel, silicon readily forms nickel silicide ($NiSi_x$ where $0.4 \leq x \leq 2.5$). Moreover, the present inventors noticed that the lattice constant of nickel silicide is near to that of silicon. Accordingly, the free energy of a ternary crystalline silicon-nickel silicide-amorphous silicon system was simulated to confirm that amorphous silicon easily undergoes reaction with nickel silicide at the phase boundary to form nickel silicide and crystalline silicon according to the chemical reaction expressed by:

amorphous silicon (silicon A)+nickel silicide (silicon B)→nickel silicide (silicon A)+crystalline silicon (silicon B)

wherein, silicon A and silicon B indicates the location of the silicon atoms. The potential barrier for this reaction is sufficiently low, and the reaction takes place at a low temperature.

Figure 3:
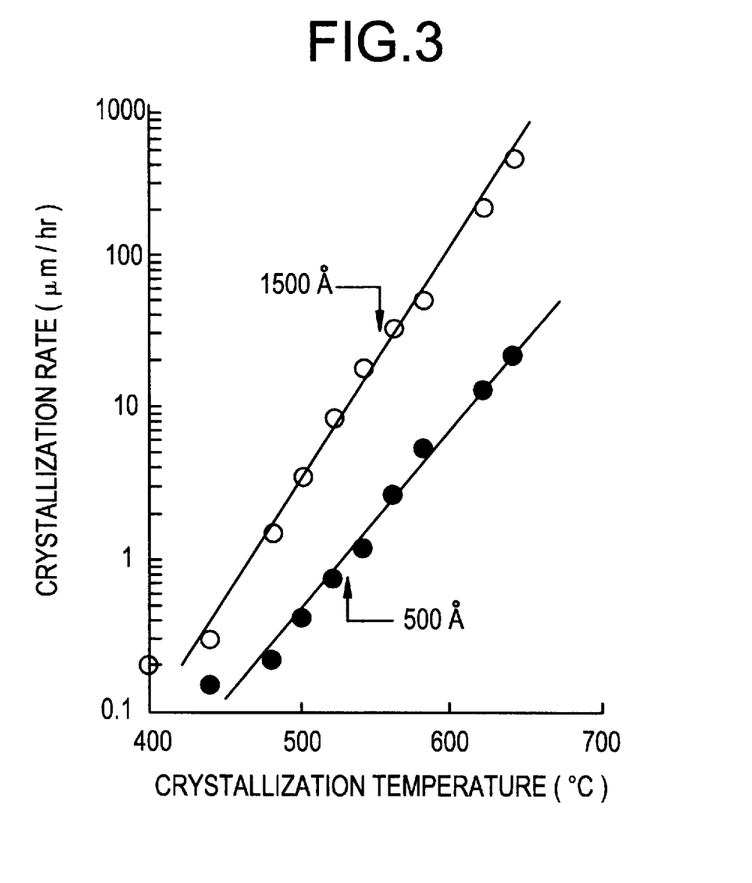
FIG. 3 shows the relation between the crystallization rate of silicon and the temperature of crystallization.

The reaction expressed by the formula above suggests that nickel atoms convert amorphous silicon into crystalline silicon. In practice, the reaction is initiated at a temperature not higher than 580° C.; the reaction is observed to occur even at a temperature as low as 450° C. More typically, the crystallization can be effected at a temperature lower than the crystallization temperature of a conventional amorphous silicon by 20° to 150° C. As a matter of course, the reaction proceeds faster with elevating the crystallization temperature. This is clearly illustrated in FIG. 3 (which is to be referred in the Examples hereinafter). Similar effects were obtained in cases using platinum (Pt), iron (Fe), cobalt (Co) or palladium (Pd).

The process according to the present invention is characterized in that the crystal growth proceeds isotropically to cover a circular area. This is because nickel atoms and the like move isotropically, and is therefore different from the conventional crystallization in which the crystals grow along the lattice plane of the crystal.

In the process according to the present invention, nickel, iron, cobalt, platinum or palladium, either as pure metal or as a silicide thereof in the form of a film, particles, clusters, etc., is provided in an island-like, a stripe-like, a linear, or a dot-like morphology, so that it may provide the starting point to develop and extend the area of crystallization into the peripheral portions thereof.

As described in the foregoing, the crystalline silicon thus obtained in the process above differs from a conventional one obtained by solid phase epitaxial growth, however, it still has an excellent structural continuity and a crystal similar to that of a single crystal silicon. Thus, the crystalline silicon obtained by the present process can be suitably used in the fabrication of a semiconductor device such as a TFT. Furthermore, it is found difficult to obtain a thin film of improved degree of crystallization (crystallinity) when the material containing nickel, iron, cobalt, platinum or palladium is spread uniformly over the substrate, because there are provided an infinite number of crystallization cites. The difference between the case of providing the material containing nickel, iron, cobalt, platinum or palladium in a uniform thin film covering the entire surface and the case of providing the material in an island-like, a stripe-like, linear, or a dot-like pattern, is clearly observed by means of Raman scattering spectroscopy and X-ray diffraction analysis. It is confirmed by these analytical means that a superior crystalline silicon is obtained by the process according to the present invention.

The amorphous silicon film to be used as the starting material in the crystallization process according to the present invention preferably contains hydrogen at a concentration as low as possible. However, since hydrogen is discharged from the amorphous silicon film with progressive crystallization, no clear correlation was observed between the hydrogen concentration of the starting amorphous silicon film and that of the silicon film obtained by the crystallization. The hydrogen concentration of the crystalline silicon film obtained by the process according to the present invention was typically in the range of from $1 \times 10^{15}$ atoms.cm$^{-3}$ to 5% by atomic. A silicon film with still superior crystallinity can be obtained by reducing the concentration of carbon, oxygen, and nitrogen, each to a concentration of $1 \times 10^{19}$ cm$^{-3}$ or lower. Thus, the material containing nickel, iron, cobalt, or platinum must be selected taking this point into account.

However, the catalytic elements above, i.e., nickel, iron, cobalt, platinum and palladium themselves are not favorable for silicon. Accordingly, their concentration is preferably suppressed as low as possible. The present inventors have found, through an extensive study, that the concentration of these elements for a semiconductor to be used in a semiconductor device such as a TFT is preferably controlled, from the viewpoint of assuring favorable characteristics and reliability, to be in the range of from $1 \times 10^{15}$ atoms.cm$^{-3}$ to 1 atom %, and more preferably, in the range of from $1 \times 10^{15}$ to $1 \times 10^{19}$ atoms.cm$^{-3}$ as observed by SIMS (secondary ion mass spectrometer). If the concentration of the catalytic metal elements should fall below this range, sufficient crystallization would not result. If the concentration should exceed this range, on the other hand, semiconductors with poor characteristics and reliability would be obtained.

Since nickel silicide at the final end of crystallization easily undergoes dissolution in hydrofluoric acid or hydrochloric acid as a result of the reaction expressed by the formula above, nickel can be reduced from the substrate by a treatment using these acids.

A film of a substance containing nickel, iron, cobalt, platinum or palladium can be formed by any of the known physical and chemical means. For instance, usable is a method using a vacuum apparatus such as vapor phased deposition, sputtering, and CVD (chemical vapor deposition), or a method which can be performed under the atmosphere such as spin-coating, dipping (coating), doctor blade process, screen printing, and spray pyrolysis.

In particular, spin-coating or dipping process can provide films having a uniform thickness, and yet, the concentration of the resulting film can be precisely controlled. The solutions to be used in the above methods include such prepared by dissolving or dispersing an acetate, a nit e, or a carboxylate of nickel, iron, cobalt, platinum or palladium, into a solvent such as water, an alcohol (either a lower or a higher), and a petroleum solvent which may be a saturated hydrocarbon or an unsaturated hydrocarbon.

In using such substances, however, it has been feared that oxygen and carbon included in the salt may diffuse into the silicon film and that they may impair the semiconductor characteristics of the silicon film. Accordingly, the present inventors conducted a study using thermogravimetry and differential thermal analysis to find that, by properly selecting the material, such additional substances decompose to yield oxides or elements at a temperature of 450° C. or lower, and that no further diffusion of such substances occurs to allow them penetrate into the silicon film. In particular, when decomposed under a reducing atmosphere such as nitrogen gas, salts such as acetates and nitrates were found to yield elemental metal at a temperature of 400° C. or lower. These salts were found to yield oxides at first through decomposition in an oxygen atmosphere, but they finally yielded elemental metal at higher temperatures upon the desorption of oxygen.

In employing the crystalline silicon film thus fabricated by the process according to the present invention in a semiconductor device such as a TFT, it can be seen that the final end of the crystallized portion is not favorable to provide a semiconductor device. As described in the foregoing, this is because the crystallization fronts initiated from a plurality of starting points collide with each other at the final end of the crystallized portion, thereby providing a large grain boundary or a discontinuity in crystallinity. Furthermore, the nickel concentration of this portion is high. Accordingly, the process for fabricating a semiconductor device according to the present invention requires to previously optimize the pattern of the semiconductor device and that of the coating containing nickel, i.e., the starting points of crystallization.

The present invention is illustrated in greater detail referring to non-limiting examples below. It should be understood, however, that the present invention is not to be construed as being limited thereto.

EXAMPLE 1

Figure 2A:
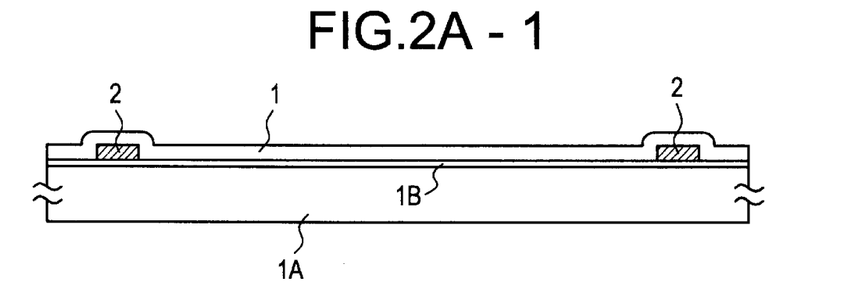
Figure 2A:
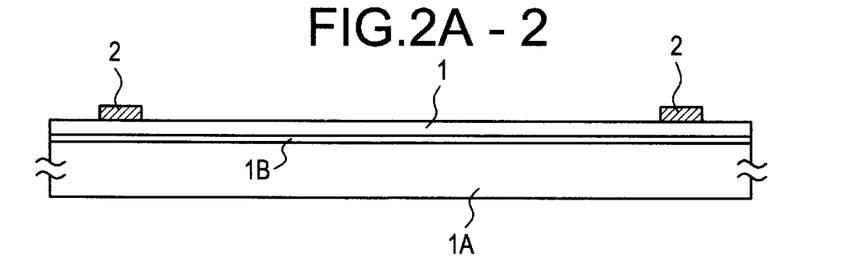

The present Example relates to a process for forming a plurality of island-like nickel films on a Corning #7059 glass substrate and then crystallizing an amorphous silicon film using these films as the starting points. The present Example also provides a process for fabricating a TFT using the thus obtained crystalline silicon film. The island-like nickel films can be formed by employing either of the two methods; i.e., forming the island-like nickel films on the amorphous silicon film, or under the amorphous silicon film. FIG. 2(A-1) shows the method for providing the island-like nickel films under the amorphous silicon film, and FIG. 2(A-2) shows the one for forming them on the amorphous silicon film. In the latter method, however, it should be taken into consideration that the etching of the thus formed nickel film on the amorphous silicon is performed as a step subsequent to the formation of the nickel films. It follows that, though at a small amount, unfavorable nickel silicide is formed through the reaction between nickel and amorphous silicon. Since a silicon film having a sufficiently high crystallinity as to satisfy the object of the present invention cannot be obtained if nickel silicide remains on the silicon film, the residual nickel silicide must be completely removed using hydrochloric acid, hydrofluoric acid, and the like. Thus, a thinner amorphous silicon film results as compared to the initially deposited film.

At any rate, nickel or nickel silicide can be patterned by either of the two conventionally known processes, i.e., an etch-off process which comprises patterning a photoresist by photolithography after forming a nickel film, and then etching the portions of the nickel film which remained uncovered by the resist, and a lift-off process which comprises patterning a photoresist by photolithography before forming a nickel film thereon, and then peeling off the underlying photoresist to selectively form the nickel film.

No problem as described above can be found on the former method referring to FIG. 2(A-1). In a process according to this method, also, the nickel film other than the island-like portions is preferably removed completely. Furthermore, the substrate is treated using an oxygen plasma or ozone and the like to oxidize the region other than the island-like regions and suppress the influence of the residual nickel.

At any rate, both processes comprise depositing a 2,000 Å thick silicon oxide base film 1B on a Corning #7059 substrate 1A by plasma CVD, and an amorphous silicon film 1 was further deposited thereon at a thickness of from 200 to 3,000 Å, preferably, at a thickness of from 500 to 1,500 Å. The amorphous film could be more easily crystallized by removing hydrogen from the amorphous film by annealing the film at a temperature of from 350° to 450° C. for a duration of from 0.1 to 2 hours.

Figure 1A:
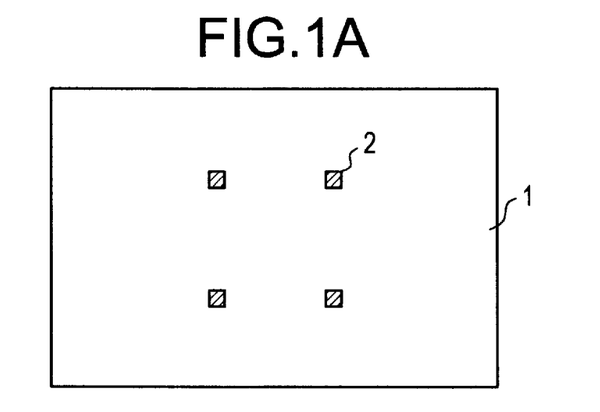
FIGS. 1(A) to 1(C) show schematically drawn step-sequential structures obtained in a process according to an embodiment of the present invention (Example 1), as viewed from the upper side.

In a process referring to FIG. 2(A-1), prior to the formation of the amorphous silicon film 1, a nickel film was deposited by sputtering at a thickness of from 50 to 1,000 Å, preferably, from 100 to 500 Å. The resulting nickel film was patterned to form an island-like nickel region 2. The resulting structure as viewed from the upper side is shown in FIG. 1(A).

The island-like nickel portions are each formed in squares $2 \times 2$ $\mu m^2$ in size and taking a distance of from 5 to 50 $\mu m$, more specifically, for example, 20 $\mu m$, between each other. A similar effect was obtained by using nickel silicide in the place of nickel. Furthermore, favorable results were obtained by heating the substrate in the temperature range of from 100° to 500° C., preferably in the range of from 180° to 250° C. This is ascribed to an increase in the tightness of adhesion between the base silicon oxide film and the nickel film, and to the formation of nickel silicide through the reaction between silicon oxide and nickel. Similar effects can be obtained by using silicon nitride, silicon carbide, or silicon in the place of silicon oxide.

Figure 2B:
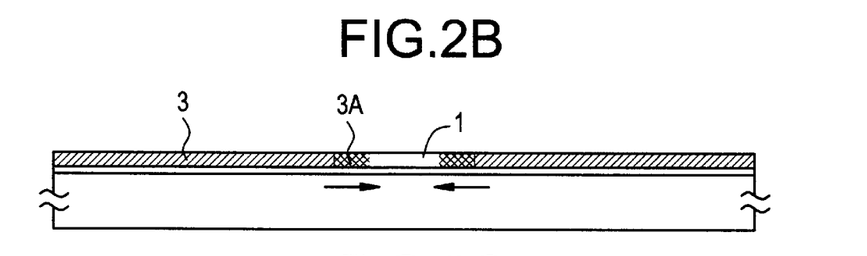
Figure 2C:
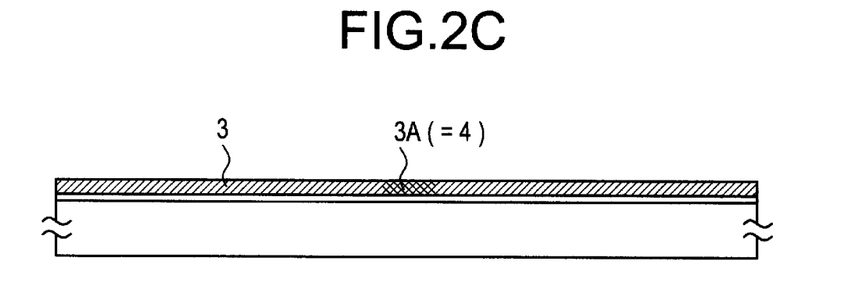

The resulting structure was annealed in the temperature range of from 450° to 650° C., specifically, for example, at 550° C. for a duration of 8 hours in a nitrogen atmosphere. The intermediate state during heating is illustrated in FIG. 2(B). It can be seen in FIG. 2(B) that nickel proceeds to the central portion to form nickel silicide 3A from an island-like nickel film which was located at the end of FIG. 2(A). Furthermore, it can be also seen that the portion 3 through which nickel had passed provides crystalline silicon. Thus, the crystallization is completed at the point the advancing fronts initiated from two differing island-like portions collide with each other and provide a residual nickel silicide 3A at the center. This is shown in FIG. 2(C).

Figure 4:
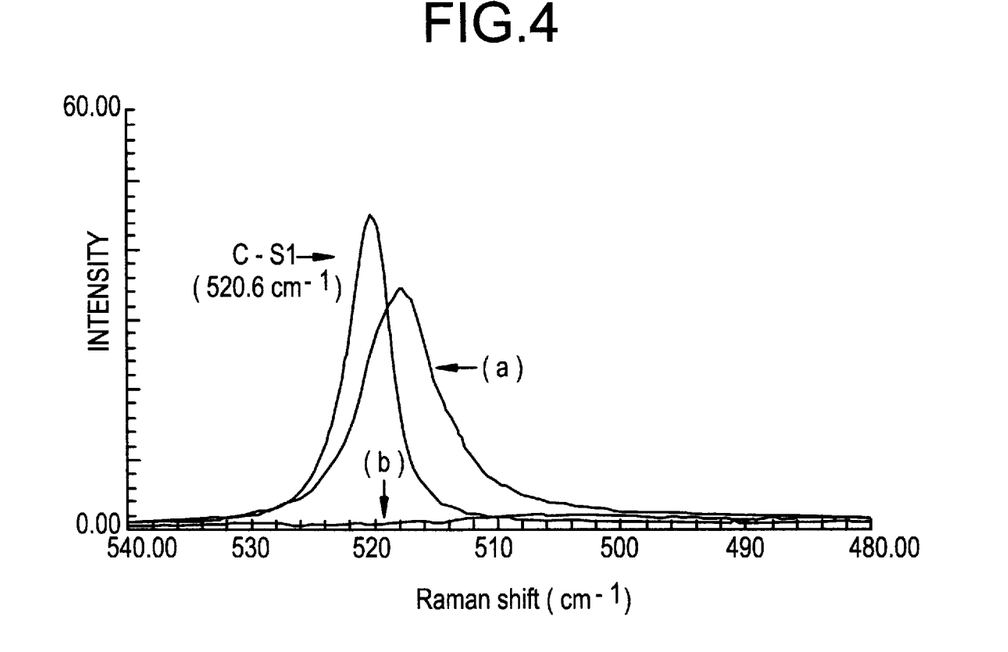
FIG. 4 shows the result of Raman scattering spectroscopy of a crystalline silicon film obtained in an Example.
Figure 5:
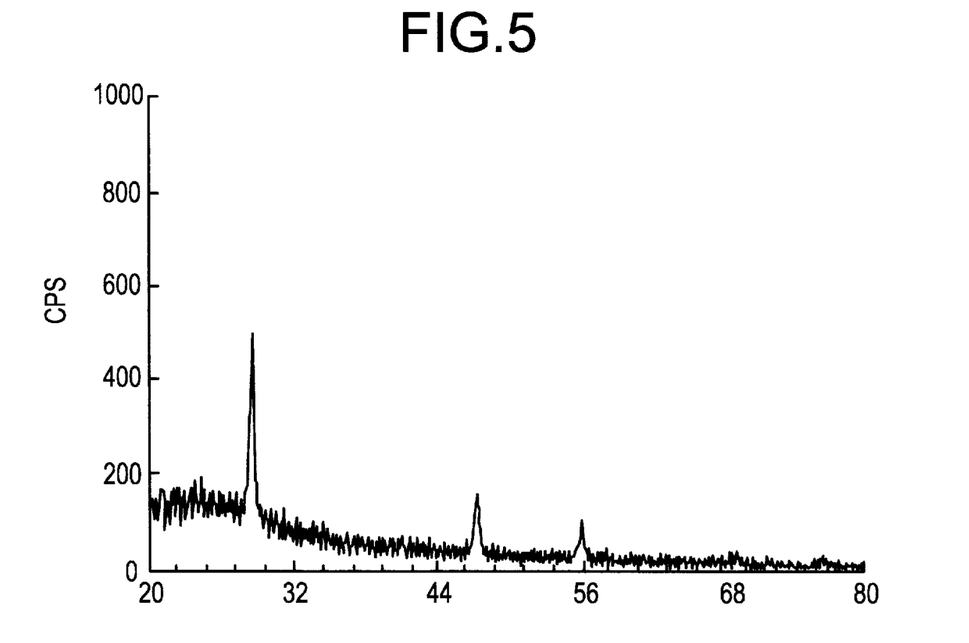
FIG. 5 shows the X-ray diffraction pattern of a crystalline silicon film obtained in an Example.

FIG. 4 and FIG. 5 each provide the Raman scattering spectrogram and the X-ray diffractogram, respectively, of the resulting crystalline silicon film. In FIG. 4, the curve marked with C-Si corresponds to the Raman spectrum of a standard sample, i.e., single crystal silicon. The curves indicated by (a) and (b) each represent the Raman spectra for a silicon film obtained by the process according to the present invention, and that for the non-crystallized regions. It can be seen clearly from the results that the process according to the present invention provides a favorable silicon crystal.

Figure 1B:
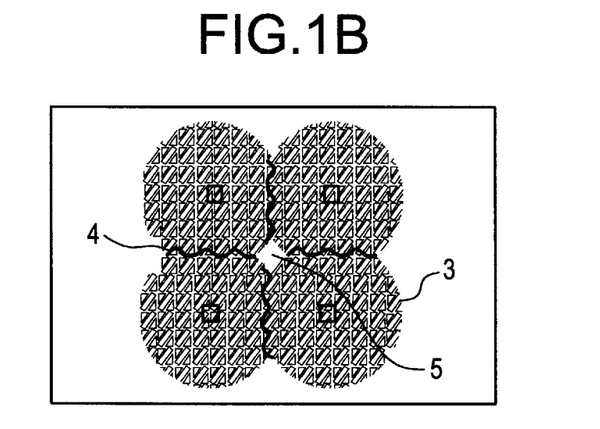

FIG. 1(B) provides the structure obtained up to the present step, as viewed from the upper side of the substrate. In FIG. 2(C), nickel silicide 3A in FIG. 2(C) corresponds to the grain boundary 4. By further continuing the annealing, nickel moves along the grain boundary 4 and aggregates in the intermediate region 5 of the island-like nickel portions which are all deformed from their initial shapes.

Figure 1C:
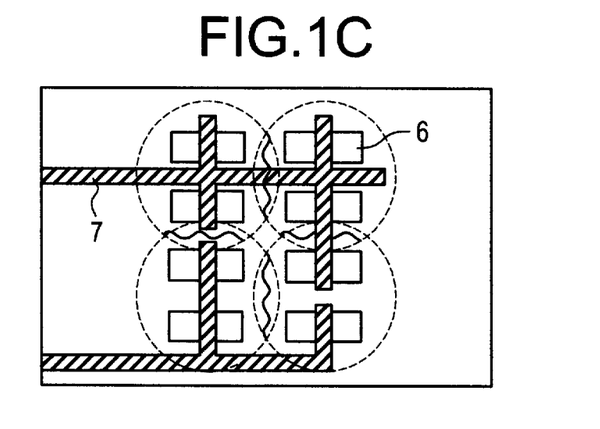
Figure 2D:
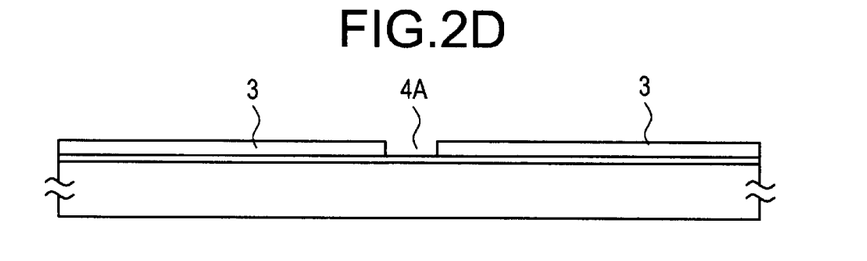

A crystalline silicon can be obtained by the steps as described in the foregoing. It is not preferred, however, for the crystallin silicon to have nickel diffused into the semiconductor coating from the thus formed nickel silicide 3A. Accordingly, it is preferred that the etching is subjected to etching using hydrofluoric acid or hydrochloric acid, because these acids do not affect the silicon film. The structure thus obtained by etching is shown in FIG. 2(D). A groove 4A is obtained in the place of the former grain boundary. It is not preferred to form the semiconductor regions (active layer and the like) in such a manner that the groove is incorporated between the semiconductor regions. An example for the arrangement of the TFTs is shown in FIG. 1(C). The gate connection 7, on the other hand, can cross the grain boundary 4.

An amorphous silicon film was crystallized according to the above means using a 2×2-$\mu$m$^2$ nickel region as the starting area. The dependence of the crystallization rate on the annealing temperature was studied. The crystallization rate was calculated by measuring the duration of annealing necessary for the crystallization front to reach a distance of from 10 to 50 $\mu$m away from the nickel region. The results are given in FIG. 3 as an example. Two types of amorphous silicon films, one having a thickness of 500 Å and the other having a thickness of 1,500 Å, were prepared to compare the results. As a matter of course, the crystallization rate is greater for a higher annealing temperature. The crystallization rate also depends on the film thickness, and the crystallization occurs more easily with increasing the film thickness. Since a practical semiconductor typically has a size of 50 $\mu$m or less, a crystallization rate of at leas; 20 $\mu$m/hr is necessary if the annealing is performed for a durat on of 5 hours. For a silicon having a thickness of 1,500 Å, it can be read from FIG. 3 that the annealing must be performed at a temperature of 550° C. or higher.

EXAMPLE 2

The present example relates to a process for fabricating a crystalline silicon film using the constitution described in Example 1, except that the crystallinity of the film is further improved by irradiating a laser beam after once crystallizing the film by heating. The steps and conditions of the steps other than that of the laser irradiation are the same with those described in FIG. 1. The symbols and numbers in FIG. 6 corresponds to the same referred to in Example 1.

Referring to FIG. 6, the process steps for fabricating a semiconductor according to the present example is described below. The steps (A-1) through (B) are the same as those explained in Example 1. After conducting the step with reference to FIG. 6(B), crystals were allowed to grow along the transverse direction, and a laser beam was irradiated thereto to further ameliorate the crystallinity of the silicon film. Thus, a KrF excimer laser was operated to irradiate a laser beam at a wave-length of 248 nm and at a pulse width of 20 nsec to the surface of the resulting crystalline silicon film to further accelerate the crystallization thereof. The laser beam was irradiated at an output energy density of from 200 to 400 mJ/cm$^2$, for instance 250 mJ/cm$^2$ in this case, for 2 shots. During the laser beam irradiation, the substrate was maintained at a temperature of from 150° to 400 ° C., more specifically, for example, at 200° C., by heating, thereby fully enhancing the effect of laser beam irradiation.

Usable laser light other than that of the KrF excimer laser above include those emitted from a XeCl excimer laser operating at a wavelength of 308 nm and an ArF excimer laser operating at a wavelength of 193 nm. Otherwise, an intense light may be irradiated in the place of a laser light. In particular, the application of RTA (rapid thermal annealing) which comprises irradiating an infrared light is effective because it can selectively heat the silicon film in a short period of time.

Thus, a silicon film having a favorable crystallinity can be obtained by employing any of the aforementioned methods. The previously crystallized region 3 obtained as a result of thermal annealing was found to change into a silicon film having a further improved crystallinity. On the other hand, the region (not shown in the figure) which did not crystallize during the thermal annealing was found to yield a polycrystalline film as a result of laser irradiation. Raman scattering spectroscopy revealed that the silicon film undergoes modification, but that the crystallinity of the thus obtained polycrystalline film is poor. Furthermore, observation by transmission electron microscope revealed that a large number of fine crystals form in the film which was subjected to laser irradiation without once crystallizing it by thermal treatment. In contrast to this, relatively large grains of oriented crystallites were found to constitute the thermally annealed and laser-irradiated film 3 obtained according to the present invention.

Figure 6A:
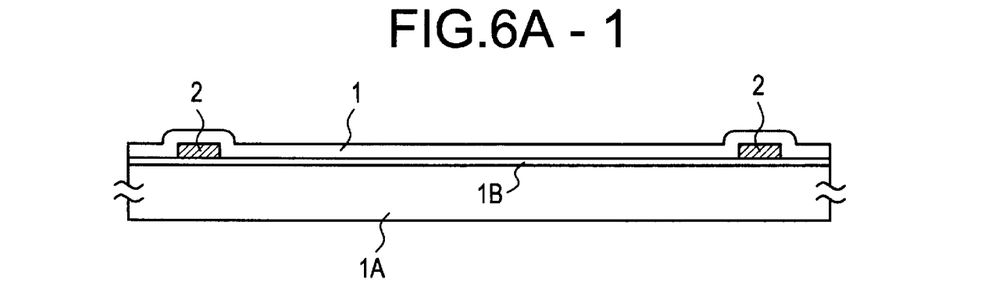
Figure 6A:
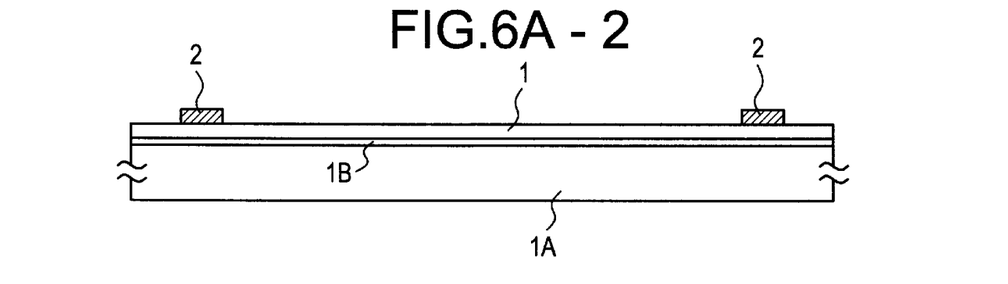
Figure 6B:
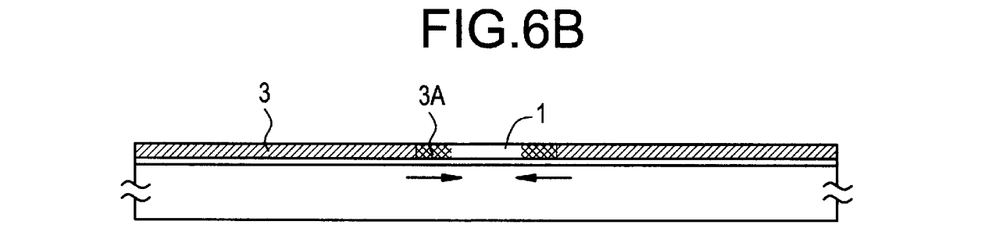
Figure 6C:
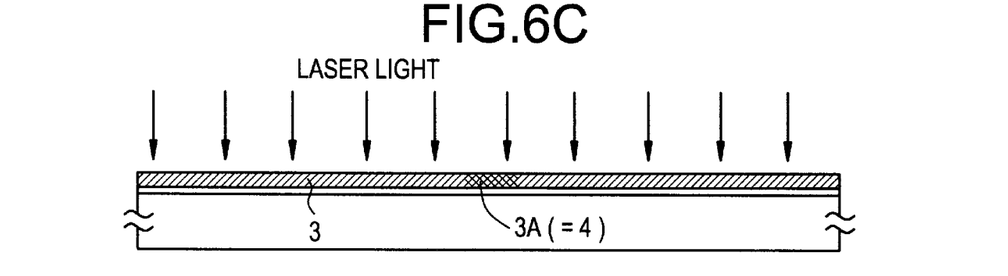
Figure 6D:
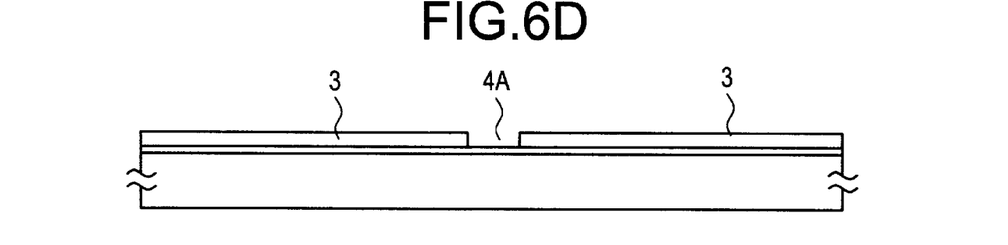

After the completion of laser irradiation, the front end 3A of crystal growth was etched using hydrofluoric acid or hydrochloric acid. The structure obtained by etching is shown in FIG. 6(D).

Thus, a TFT was fabricated from a silicon film 3 shaped into an island-like morphology. A remarkable increase in device characteristics was observed on this TFT. More specifically, an N-channel TFT obtained by employing the crystallization step described in Example 1 yields a field-effect mobility of from 50 to 90 cm$^2$/Vs, and a threshold voltage of from 3 to 8 V. These values are in clear contrast to a mobility of from 150 to 200 cm$^2$/Vs and a threshold voltage of from 0.5 to 1.5 V obtained for the N-channel TFT fabricated in accordance with the present Example. The mobility is considerably increased, and the fluctuation in the threshold voltage is greatly reduced.

Previously, the aforementioned TFT characteristics of such a high level had to be obtained from amorphous silicon film by laser crystallization. However, the silicon films obtained by a prior art laser crystallization yielded fluctuation in the characteristics. Furthermore, the crystallization process required an irradiation of a laser light at an energy density of 350 mJ/cm$^2$ or higher at a temperature of 400° C. or higher, and it was therefore not applicable to mass production. In contrast to the conventional processes, the process for fabricating a TFT according to the present Example can be performed at a substrate temperature and at an energy density both lower than the corresponding values of the conventional processes. Accordingly, the process according to the present invention is suitable for mass production. Furthermore, the quality of the devices obtained by the present process is as uniform as the one for the devices obtained by a conventional solid phase growth crystallization using thermal annealing. Accordingly, TFTs of uniform quality can be obtained stably.

In the present invention, the crystallization was found to occur insufficiently when the nickel concentration was low. However, the process according to the present Example employs laser irradiation to compensate for an insufficient crystallization. Accordingly, TFTs with satisfactorily high quality can be obtained even when the nickel concentration is low. This signifies that devices containing nickel at a still lower concentration can be implemented, and that devices having excellent electric stability and reliability can be obtained.

EXAMPLE 3

The present example relates to a process for introducing a catalytic element into the amorphous film by coating the upper surface of the amorphous silicon film with a solution containing a catalytic element which accelerates the crystallization of the amorphous silicon film. Nickel is used as the catalytic element in this Example. The present Example is mostly the same as that described in Example 1, except for the method of introducing nickel. The crystallization step and the steps subsequent thereto are the same as those described in Example 1. It is also the same as in Example 1 that the structure viewed from the upper side of the substrate corresponds to FIG. 1.

FIG. 7 shows schematically the step-sequential fabrication process according to the present invention. A silicon oxide film 1B as a base coating was deposited on a 10×10-cm² square Corning #7059 glass substrate 1A, and a 1,000 Å thick amorphous silicon film 1 was deposited further thereon by plasma CVD.

A silicon oxide film 13 was deposited on the resulting amorphous silicon film to a thickness of 1,200 Å to provide a mask. A silicon oxide film 13 as thin as 500 Å in thickness can be used without any problem, and the film can be made even thinner by using a denser film.

The resulting silicon oxide film 13 was patterned as desired by an ordinary photolithographic patterning. Then, a thin silicon oxide film 12 was deposited in an oxygen atmosphere by irradiating ultraviolet (UV) light. More specifically, the silicon oxide film 13 was fabricated by irradiating the UV light for 5 minutes. The silicon oxide film 12 is believed to have a thickness of from 20 to 50Å.

Figure 7A:
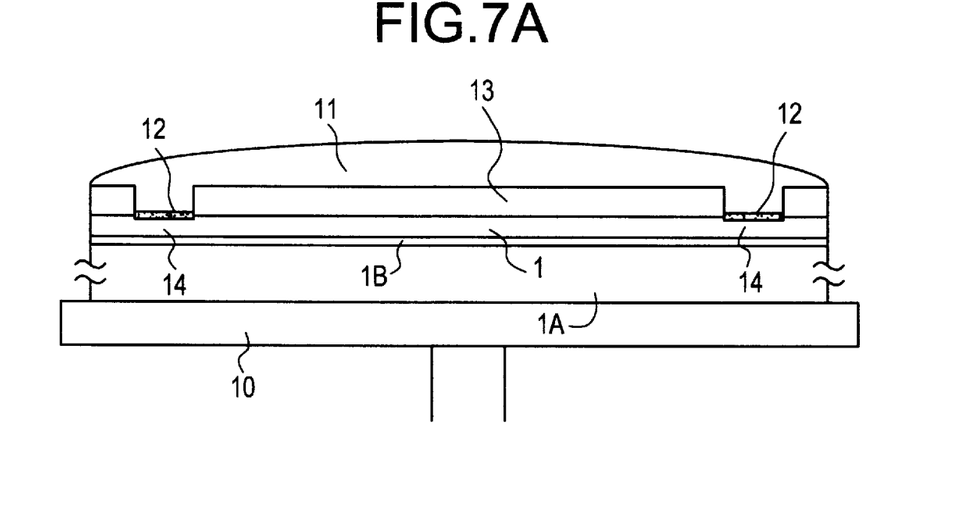
FIGS. 7(A) to 7(D) show schematically drawn step-sequential cross section structures obtained in a process for fabricating a semiconductor according to a further another embodiment of the present invention.

The silicon oxide film above is formed for improving wettability of the pattern with the solution to be applied hereinafter. Accordingly, a 5-ml portion of an acetate solution 11 containing 100 ppm by weight of nickel was dropped on the surface of a 10×10-cm² square substrate. A spinner 10 was operated for 10 seconds at a rate of 50 rpm to form a uniform aqueous film on the entire surface of the substrate. The spinner 10 was operated for an additional 60 seconds at a rate of 2,000 rpm to effect spin drying after maintaining the substrate for 5 minutes. The substrate may be subjected to rotation at a rate of from 0 to 150 rpm on a spinner. This step is illustrated in FIG. 7(A).

Subsequent to the removal of the silicon oxide mask 13, the resulting structure was subjected to heat treatment at 550° C. under a nitrogen atmosphere for a duration of 4 hours to crystallize the amorphous silicon film 1. In this manner, crystallization is allowed to occur from the region 14 into which nickel was introduced to the region into which nickel was not introduced along the transverse direction.

Figure 7B:
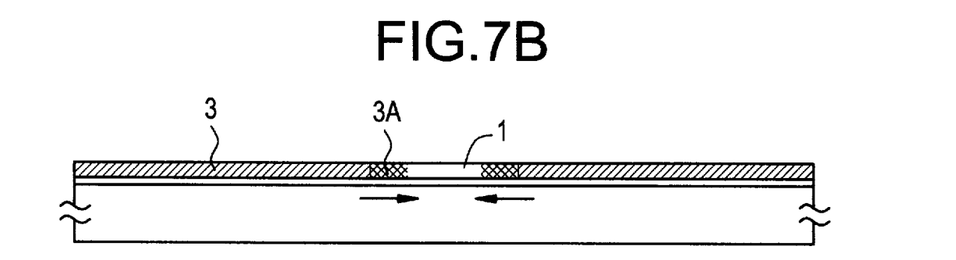
Figure 7C:
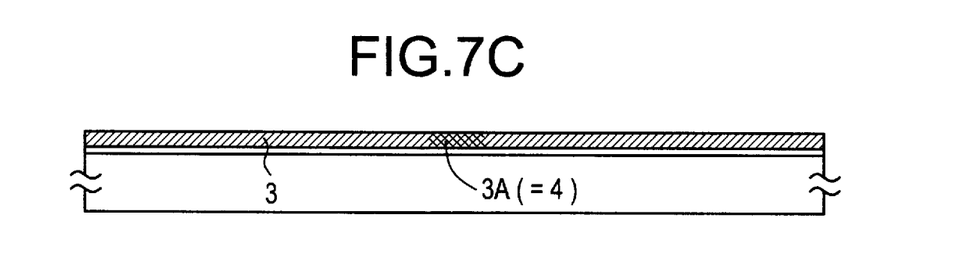

Referring to FIG. 7(B), it can be seen that the crystallization is initiated from the region 14 into which nickel was directly introduced, and that it proceeds transversely towards the central portion. A crystalline silicon film 3 is obtained in this manner. Silicon nitride is formed in the region 3A at which the growth fronts of the crystals collide with each other.

Figure 7D:
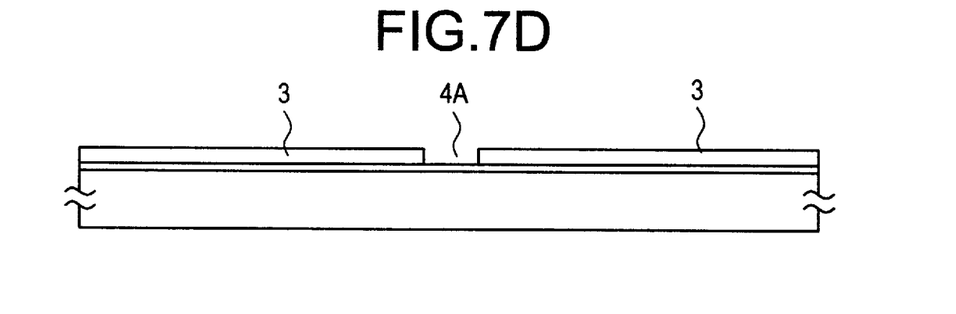

Then, the region 3A of nickel nitride was removed using hydrofluoric acid or hydrochloric acid. The structure thus obtained by etching is shown in FIG. 7(D).

Figure 8:
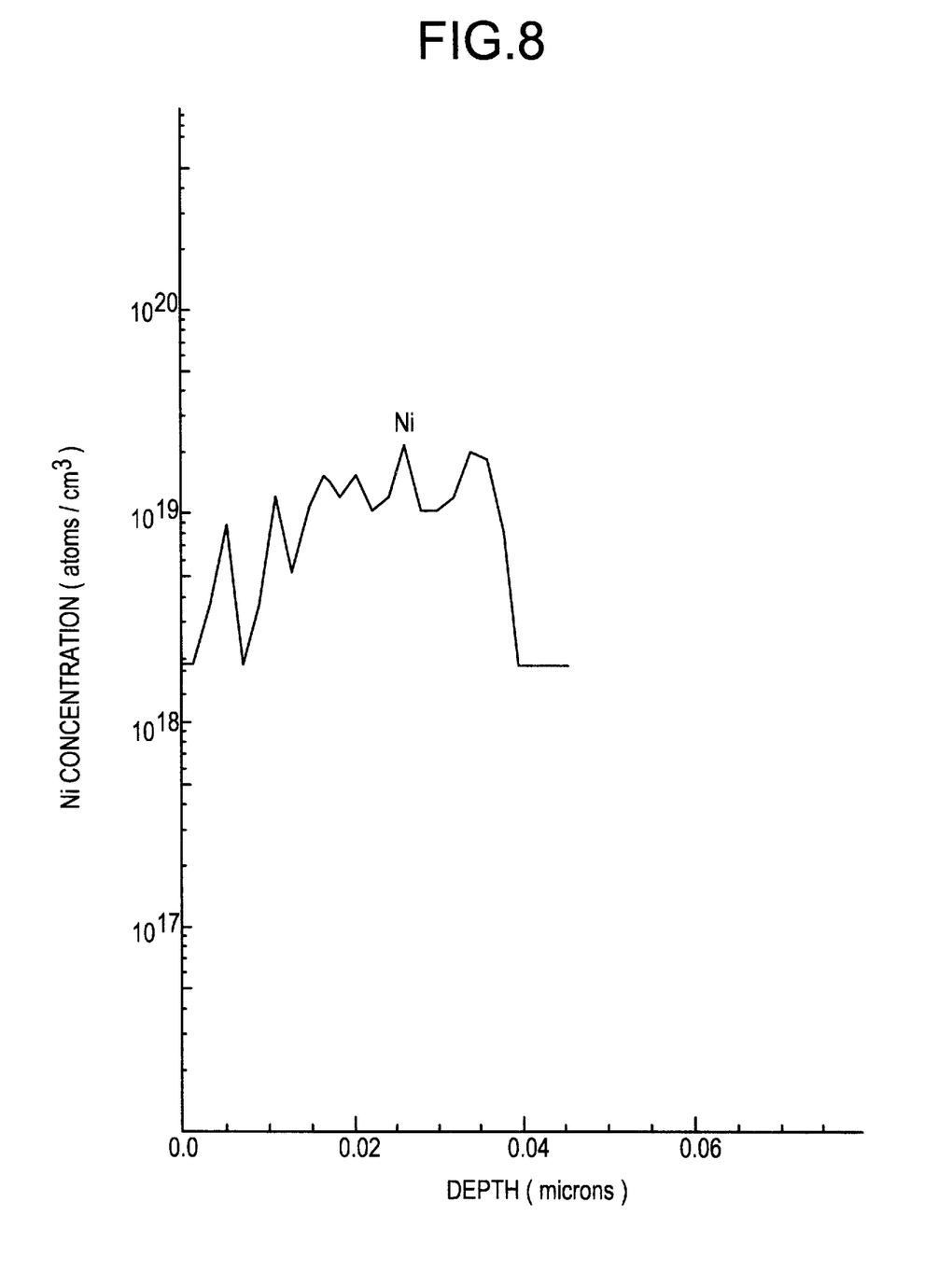
FIG. 8 shows a nickel concentration distribution in a crystalline silicon film.

The concentration profile of nickel in this region is shown in FIG. 8. The nickel concentration in the crystalline silicon film upon completion of the crystallization was examined by SIMS (secondary ion mass spectroscopy). It is confirmed that the nickel concentration of the region 14 into which nickel was directly introduced yield a value still higher than the concentration shown in FIG. 8 by a digit or more.

It is also effective to further improve the crystallinity of the crystalline silicon film obtained above by irradiating a laser beam or an intense light equivalent thereto in the same manner as in the foregoing Example 2. In the case of Example 2, the morphology of the film was impaired by laser irradiation because grains of nickel silicide from about 0.1 to 10 μm precipitated from the nickel film having a relatively high nickel concentration. However, since the nickel concentration of the nickel film can be far reduced as compared with those obtained in Examples 1 and 2, the precipitation of nickel silicide and hence surface roughening can be prevented from occurring.

The nickel concentration as shown in FIG. 8 can be controlled by changing the nickel concentration of the solution to be applied. In the present invention, the nickel concentration in the solution was adjusted to 100 ppm. However, it is confirmed that the crystallization also occurs even when the concentration is decreased to 10 ppm. Crystallization occurs in the same manner by using a solution containing nickel at a concentration of 10 ppm. In this case, the nickel concentration as shown in FIG. 8 can be further lowered by a digit. However, the use of a solution containing nickel at too low a concentration shortens the distance of crystal growth along the transverse direction indicated by the arrow, and is therefore not desired.

An acetate solution was used in the present example as a solution containing the catalytic element. However, other usable solutions include an aqueous solution selected from a wide variety, and a solution containing an organic solvent. The catalytic element need not necessary be included as a compound, and it may be simply dispersed in the solution.

The solvent for the catalytic element can be selected from the group consisting of polar solvents, i.e., water, alcohol, acids, and ammonia water.

When nickel is used as the catalytic element, nickel is incorporated into a polar solvent in the form of a nickel compound. The nickel compound is selected from, representatively, the group consisting of nickel bromide, nickel acetate, nickel oxalate, nickel carbonate, nickel chloride, nickel iodide, nickel nitrate, nickel sulfate, nickel formate, nickel acetylacetonate, nickel 4-cyclohexylbutyrate, nickel oxide, and nickel hydroxide.

The solvent may be selected from a non-polar solvent selected from the group consisting of benzene, toluene, xylene, carbon tetrachloride, chloroform, and ether.

In this case, nickel is involved in the solution in the form of a nickel compound, which is selected from the group consisting of nickel acetylacetonate, and nickel 2-ethylhexanate.

It is also effective to add a surfactant into the solution containing a catalytic element. A surfactant increases the adhesiveness of the solution to the surface of the silicon oxide film, and controls the adsorptivity. The surfactant may be applied previously to the surface to be coated. If elemental nickel is used as the catalytic element, it must be previously dissolved into an acid to obtain a solution thereof.

Instead of using a solution containing nickel completely dissolved into the solution, an emulsion, i.e., a material comprising a dispersing medium uniformly dispersed therein a powder of metallic nickel or of a nickel compound, can be used.

The same applies in other cases using a material other than nickel as the catalytic element.

A solution containing a non-polar solvent, i.e., a toluene solution of nickel 2-ethylhexanate, can be directly applied to the surface of an amorphous silicon film. In this case, it is effective to use a material such as an adhesive generally employed in forming a resist. However, the use of the adhesive in an excess amount reversely interferes the transfer of the catalytic element into amorphous silicon.

The catalytic element is incorporated into the solution approximately in an amount as nickel of, though depending on the type of the solution, from 1 to 200 ppm by weight, and preferably, from 1 to 50 ppm by weight. This range of addition is determined by taking the nickel concentration of the crystallized film and the resistance against hydrofluoric acid into consideration.

As described in the foregoing, the present invention is epoch-making in that it enables the crystallization of an amorphous silicon to take place at an even lower temperature and within a shorter period of time. Furthermore, the process according to the present invention is suitable for mass production, and yet, it can be performed employing the most commonly used equipments, apparatuses, and methods. Accordingly, it is a promising and a beneficial process for the electronic industry.

More specifically, for instance, a conventional solid phase growth process requires an annealing step for a duration of at least 24 hours. Considering that the process time per substrate is preferably 2 minutes, 15 annealing furnaces are necessary to make the process practically feasible. However, the present invention allows the process to complete within 8 hours, and under optimal conditions, the process can be even more shortened to a mere 4 hours or less. This signifies that the process can be performed while reducing the number of furnaces to only a sixth or less of the above calculated number. This leads to an increase of productivity and the cutting down of equipment investment, thereby lowering the process cost of the substrates. Accordingly, economical TFTs can be produced, and this might call novel demands. Conclusively, the present invention is greatly beneficial for the industry.

While the invention has been described in detail and with reference to specific embodiments thereof, it will be apparent to one skilled in the art that various changes and modifications can be made therein without departing from the spirit and scope thereof.

What is claimed is:

1. A process for fabricating a semiconductor comprising:
    forming a semiconductor film comprising silicon on an insulating surface of a substrate;
    disposing a metal containing catalyst in contact with a first portion of said semiconductor film;
    annealing said semiconductor film to crystallize said semiconductor film without removing said catalyst; and then
    treating a surface of said semiconductor film with an etchant selected from the group consisting of hydrofluoric acid and hydrochloric acid to remove said metal at least from a second portion of said semiconductor film, said second portion being distant from said first portion.

2. The process of claim 1 wherein said annealing step is performed at a temperature 20°–150° C. lower than the crystallization temperature of an amorphous silicon without said catalyst.

3. The process of claim 1 wherein said annealing step is carried out at a temperature of 450° to 650° C.

4. The process of claim 1 wherein said catalyst is formed on a silicon oxide film formed on said substrate with said substrate being heated at a temperature of 100° to 500° C.

5. The process of claim 1 wherein said substrate comprises glass, and said annealing step is performed at a temperature not higher than a glass transition temperature of said substrate.

6. A method according to claim 1 wherein said metal containing catalyst is disposed on or under said semiconductor film.

7. A method according to claim 1 wherein said metal is selected from the group consisting of nickel, iron, cobalt, platinum and palladium.

8. A method according to claim 1 wherein said semiconductor film is in an amorphous state before performing said annealing step.

9. A process for fabricating a semiconductor comprising:
    forming a semiconductor film comprising silicon on an insulating surface of a substrate;
    disposing a metal containing catalyst in contact with a first portion of said semiconductor film;
    annealing said semiconductor film to crystallize said semiconductor film wherein the crystallization proceeds with diffusion of said metal through said semiconductor film; and then
    treating a surface of said semiconductor film with an etchant selected from the group consisting of hydrofluoric acid and hydrochloric acid to remove said metal from at least a second portion of said semiconductor film at which said crystallization terminates.

10. The process of claim 9 wherein said annealing step is performed at a temperature 20°–150° C. lower than the crystallization temperature of an amorphous silicon without said catalyst.

11. The process of claim 9 wherein said annealing step is carried out at a temperature of 450° to 650° C.

12. A method according to claim 9 wherein said metal containing catalyst is disposed on or under said semiconductor film.

13. A method according to claim 9 wherein said metal is selected from the group consisting of nickel, iron, cobalt, platinum and palladium.

14. A method according to claim 9 wherein said semiconductor film is in an amorphous state before performing said annealing step.

15. The process of claims 1 or 9 wherein said semiconductor film comprises at least one channel region of an insulated gate field effect transistor and said catalyst is formed on at least said channel region.

16. A process for fabricating a semiconductor comprising:

forming a semiconductor film comprising silicon on an insulating surface of a substrate;

disposing a metal containing catalyst in contact with a first portion of said semiconductor film;

annealing said semiconductor film to crystallize said semiconductor film wherein the crystallization proceeds with diffusion of said metal through said semiconductor film; and then treating a surface of said semiconductor film with an etchant selected from the group consisting of hydrofluoric acid and hydrochloric acid to remove said metal from at least a second portion of said semiconductor film at which said crystallization terminates.

wherein said metal containing catalyst disposing step is carried out by coating the semiconductor film in a substantially amorphous state with a solvent containing a salt of at least one material selected from the group consisting of nickel, iron, cobalt, platinum and palladium, and wherein said solvent further contains a surface active agent.

17. A process for fabricating a semiconductor comprising:

forming a semiconductor film comprising silicon on an insulating surface of a substrate;

preparing a solution by dispersing a metal containing catalyst into a solvent;

applying said solution in contact with a first portion of said semiconductor film;

drying said solution, annealing said semiconductor film to crystallize said semiconductor film wherein the crystallization proceeds with diffusion of said metal through said semiconductor film and then treating a surface of said semiconductor film with an etchant selected from the group consisting of hydrofluoric acid and hydrochloric acid to remove said metal from at least a second portion of said semiconductor film at which said crystallization terminates, wherein said solvent further contains a surface active agent.

18. The process of claim 17 wherein said annealing step is carried out at a temperature of 450° to 650° C.

19. The process of claim 17 wherein said substrate comprises glass, and said annealing step is performed at a temperature not higher than a glass transition temperature of said substrate.

20. The process of claim 17 wherein said semiconductor film comprises at least one channel region of an insulated gate field effect transistor and said solvent is coated on at least said channel region.

21. The process of any one of claims 1, 9, 16, or 17, wherein said semiconductor film is amorphous.

22. A method of manufacturing a semiconductor device comprising the steps of:

forming a semiconductor film comprising silicon on an insulating surface of a substrate, said semiconductor film including a region to become an active region of said semiconductor device:

disposing a catalyst substance in contact with a first portion of said semiconductor film, said catalyst capable of promoting a crystallization of said semiconductor film;

annealing said semiconductor film without removing said catalyst substance to crystallize at least said region of the semiconductor film to become the active region; and etching said catalyst substance from an upper surface of said semiconductor film such that said semiconductor film is substantially not affected by the etching step.

23. The method of claim 22 wherein annealing is performed by a heat treatment.

24. The method of claim 22 wherein in an excess amount of said catalyst substance is removed by said etching.

25. The method of claim 22 wherein said catalyst substance is added into said semiconductor film at a concentration ib the range of $1\times10^{15}$ atoms/cm$^3$ to 1 atomic % as measured by secondary ion mass spectrometer.

26. The method of claim 22 wherein said catalyst substance includes a metal selected from the group consisting of Pt, Fe, Co, and Pd.

27. The method of claim 22 wherein said catalyst substance is provided in contact with a lower surface of said semiconductor film.

28. The method of claim 22 wherein said catalyst substance is provided in contact with an upper surface of said semiconductor film.

29. The method of claim 22 wherein said selected portion of the semiconductor film comprises at least one channel region of an insulated gate field effect transistor and said catalyst is disposed on at least said selected portion.

30. A method of manufacturing a semiconductor device comprising the steps of:

forming a semiconductor film comprising silicon on an insulating surface of a substrate, said semiconductor film including a region to become an active region of said semiconductor device;

disposing a metal containing catalyst in contact with a first portion of said semiconductor film;

heating said semiconductor film to crystallize at least said region of the semiconductor film wherein the crystallization proceeds with the diffusion of said metal through said semiconductor film; and selectively etching at least a second portion of the semiconductor film, said second portion being distant from said first portion.

31. A method according to claim 30 wherein said etching is performed by using a liquid etchant.

32. A method according to claim 31 wherein said etchant is selected from the group consisting of hydrochloric acid and hydrofluoric acid.

* * * * *